(12) United States Patent
Xie

(10) Patent No.: US 10,250,787 B2
(45) Date of Patent: Apr. 2, 2019

(54) CIRCUIT BOARD ASSEMBLY AND TERMINAL

(71) Applicant: Guangdong Oppo Mobile Telecommunications Corp., Ltd., Dongguan, Guangdong (CN)

(72) Inventor: Xiangkun Xie, Guangdong (CN)

(73) Assignee: Guangdong Oppo Mobile Telecommunications Corp., Ltd., Dongguan (CN)

( * ) Notice: Subject to any disclaimer, the term of this patent is extended or adjusted under 35 U.S.C. 154(b) by 0 days.

(21) Appl. No.: 15/667,848

(22) Filed: Aug. 3, 2017

(65) Prior Publication Data

US 2018/0054554 A1    Feb. 22, 2018

(30) Foreign Application Priority Data

Aug. 17, 2016  (CN) .......................... 2016 1 0682994
Aug. 17, 2016  (CN) ..................... 2016 2 0897510 U

(51) Int. Cl.
*H05K 7/14* (2006.01)
*H04N 5/225* (2006.01)
(Continued)

(52) U.S. Cl.
CPC ........... *H04N 5/2253* (2013.01); *G03B 17/00* (2013.01); *H04N 5/00* (2013.01); *H04N 5/2257* (2013.01);
(Continued)

(58) Field of Classification Search
None
See application file for complete search history.

(56) References Cited

U.S. PATENT DOCUMENTS

2009/0277963 A1* 11/2009 Van Kerkhoven ..... G03B 13/18
                                                235/462.21
2014/0104792 A1*  4/2014 Jeziorek ............... H05K 3/0061
                                                361/749
(Continued)

FOREIGN PATENT DOCUMENTS

CN    203340137 U    12/2013
CN    104717325 A     6/2015
CN    106161894 A    11/2016

OTHER PUBLICATIONS

International Search Report issued in corresponding international application No. PCT/CN2017/095317 dated Oct. 20, 2017.
(Continued)

*Primary Examiner* — Courtney L Smith
*Assistant Examiner* — Jessey R Ervin
(74) *Attorney, Agent, or Firm* — Young Basile Hanlon & MacFarlane, P.C.

(57) ABSTRACT

A circuit board assembly includes a circuit board having a first side and a second side opposite to the first side, a light sensor arranged on the circuit board and electrically coupled to the circuit board, and a camera module. The camera module includes a connector arranged on the circuit board and electrically coupled to the circuit board. Projections of the light sensor and the connector on a plane parallel to the first side and the second side are fully or partially overlapped with each other. A related terminal is also provided.

16 Claims, 2 Drawing Sheets

(51) Int. Cl.
*H05K 7/02* (2006.01)
*G03B 17/00* (2006.01)
*H04N 5/00* (2011.01)

(52) U.S. Cl.
CPC .......... H05K 7/023 (2013.01); H05K 7/1428 (2013.01); H05K 7/1438 (2013.01); H05K 7/1469 (2013.01); H05K 2201/058 (2013.01); H05K 2201/10151 (2013.01); H05K 2201/10189 (2013.01)

(56) References Cited

U.S. PATENT DOCUMENTS

| | | |
|---|---|---|
| 2014/0111685 A1 | 4/2014 | Chen |
| 2014/0313403 A1* | 10/2014 | Chen ................... H04N 5/2252 348/373 |
| 2015/0077629 A1 | 3/2015 | Jeong |
| 2017/0302831 A1* | 10/2017 | Kim ....................... G02B 5/208 |

OTHER PUBLICATIONS

Extended European search report issued in corresponding European application No. 17184199.2 dated Dec. 19, 2017.

* cited by examiner

CIRCUIT BOARD ASSEMBLY AND TERMINAL

CROSS-REFERENCE TO RELATED APPLICATION(S)

This application claims priority to Chinese Patent Application No. 201610682994.9, filed on Aug. 17, 2016, and Chinese Patent Application No. 201620897510.8, filed on Aug. 17, 2016, contents of both of which are hereby incorporated by reference in their entireties.

TECHNICAL FIELD

The present disclosure relates to circuit boards, and particularly to a circuit board assembly and a terminal.

BACKGROUND

Presently, for terminals such as mobile phones, tablet computers, handheld computers, and so on, most electronic components, for example a light sensor and one or more camera modules, are arranged on one side of a circuit board along a direction parallel to the side of the circuit board, which may occupy a great space of the circuit board along the direction parallel to the side of the circuit board.

BRIEF DESCRIPTION OF THE DRAWINGS

In order to illustrate the technical solutions of the implementations of the present disclosure more clearly, the drawings used in the description of the implementations will be briefly described, it will be apparent that the drawings described in the following are implementations of the present disclosure, and it will be apparent to those skilled in the art that other drawings can be obtained from the drawings without any creative work.

DETAILED DESCRIPTION

In order to illustrate the technical solutions of the present disclosure or the related art more clearly, a brief description of the accompanying drawings used herein is given below. Obviously, the drawings listed below are only examples, and a person skilled in the art should be noted that, other drawings can also be obtained on the basis of these exemplary drawings without creative work.

In the following description, numerous specific details are set forth in order to facilitate a thorough understanding of the present disclosure, however, the present disclosure can be practiced otherwise than as specifically described herein, and therefore, the scope of the present disclosure is not to be limited to the specific implementations disclosed below.

The present disclosure provides a circuit board assembly configured to accommodate various electronic components of a terminal, for example, a mobile phone, a laptop computer, a handheld computer, and so on.

Figure 1:
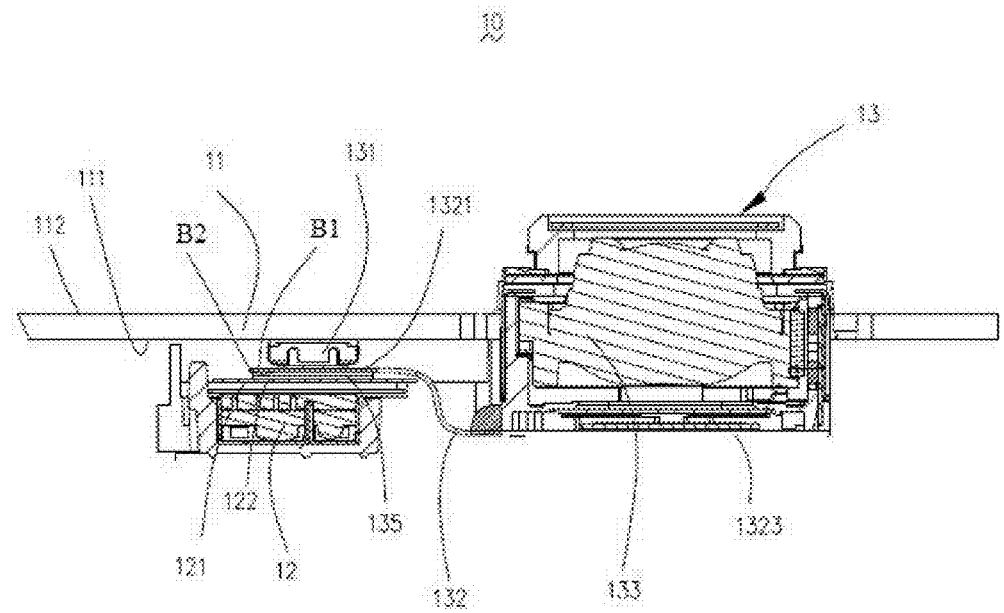
FIG. 1 is a partial sectional view of a circuit board assembly in accordance with an implementation of the present disclosure.
Figure 2:
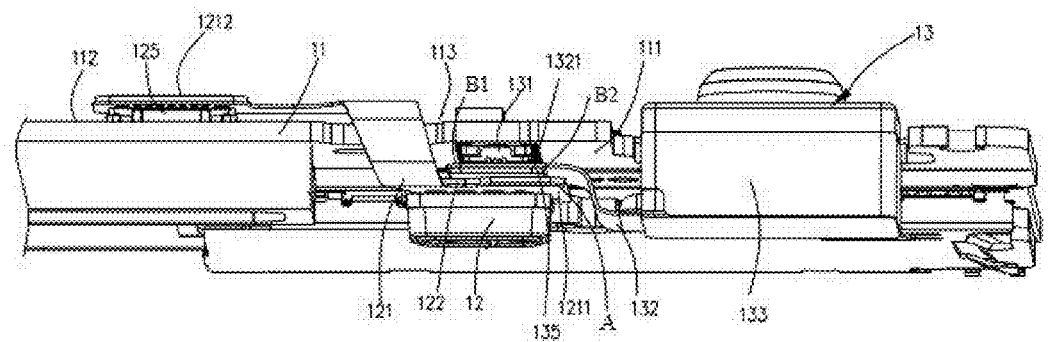
FIG. 2 is another sectional view of the circuit board assembly of FIG. 1, viewed from another viewpoint.

Referring to FIG. 1 and FIG. 2, a circuit board assembly 10 may include a circuit board 11, a light sensor 12 arranged on the circuit board 11 and electrically coupled to the circuit board 11, and a camera module 13. The circuit board 11 may have a first side 111 and a second side 112 opposite to the first side 111. The camera module 13 may include a connector 131 arranged on the circuit board 11 and electrically coupled to the circuit board 11. Projections of the light sensor 12 and the connector 131 on a plane parallel to the first side 111 and the second side 112 of the circuit board 11 is partially or fully overlapped with each other.

In the implementation, the light sensor 12 and the connector 131 are arranged on the first side 111. The light sensor 12 is laminated on the connector 131 along the direction perpendicular to the first side 111.

The circuit board assembly 10 may further include a first flexible printed circuit 121. The light sensor 12 is arranged on one end of the first flexible printed circuit 121, and another end of the first flexible printed circuit 121 away from the light sensor 12 is fixed to the second side 112 of the circuit board 11, so that the first flexible printed circuit 121 is electrically coupled to the circuit board 11 and the light sensor 12. Furthermore, the end of the first flexible printed circuit 121 away from the light sensor 12 is fixed to the second side 112 of the circuit board 11, thus the occupied space of the first side 111 can be reduced.

The first flexible printed circuit 121 may have a first surface 1211 and a second surface 1212 opposite to the first surface 1211. The first surface 1211 has a portion A away from the connector 131, and the light sensor 12 is arranged on the portion A of the first surface 1211. It can be understood that the first flexible printed circuit 121 may be coupled to the light sensor 12 in a socket joint manner.

A notch 113 may be defined in the circuit board 11 adjacent to the connector 131. The first flexible printed circuit 121 passes through the notch 113 and is fixed to the second side 112 of the circuit board 11, so that the first flexible printed circuit 121 may not be extended too much, and a bent portion of the first flexible printed circuit 121 may not be exposed outside of the edge of the circuit board 11, which can reduce or prevent damage to the bent portion. In the implementation, an end of the first surface 1211 away from the light sensor 12 is provided with an optical connector 125. The first flexible printed circuit 121 is electrically coupled to the second side 112 of the circuit board 11 via the optical connector 125.

The second surface 1212 of the first flexible printed circuit 121 is provided with a reinforcement plate 122. The reinforcement plate 122 is arranged on a location of the second surface 1212 corresponding to the portion A of the first surface 1211. The reinforcement plate 122 can increase the rigidity of the first flexible printed circuit 121, so that the first flexible printed circuit 121 can be electrically coupled to the light sensor 12 stably.

The camera module 13 may further include a second flexible printed circuit 132 and a camera 133. The connector 131 and the camera 133 are coupled to two opposite ends of a surface of the second flexible printed circuit 132, and are electrically coupled to the second flexible printed circuit 132.

The second flexible printed circuit 132 may have a first end 1321 and a second end 1323 (see FIG. 1) opposite to the first end 1321. The first end 1321 is coupled to the connector 131. The second end 1323 is coupled to the camera 133.

The first end 1321 of the second flexible printed circuit 132 is arranged between the connector 131 and the light sensor 12. The portion A of the first flexible printed circuit 121 is laminated on the first end 1321. The first end 1321 of the second flexible printed circuit 132 may have a first surface B1 and a second surface B2 opposite to the first surface B1. The first surface B1 is attached to a surface of the connector 131 away from the first side 111 of the circuit board 11. Since the second flexible printed circuit 132 is flexible, the connector 131 and the camera 133 are arranged on two opposite ends of the second flexible printed circuit 132, the connector 131 is attached to the circuit board 11, and the camera 133 is arranged on an end of the circuit board 11 and the thickness of the camera 133 is greater than that of the connector 131, so that a height difference of the two opposite ends of the second flexible printed circuit 132 is generated when the center of the second flexible printed circuit 132 is bent. The light sensor 12 is laminated on the connector 131, so that a total of the height of the connector 131 and the height of the light sensor 12 is substantially the same as that of the camera 133, thus the layout of the circuit board 11 is suitable for mounting the circuit board 11.

A cushion 135 is provided between the second surface B2 of the first end 1321 of the second flexible printed circuit 132 and the light sensor 12. The cushion 135 is arranged between the second surface B2 and the portion A of the first surface 1211. The cushion 135 can reduce an impact between the connector 131 and the light sensor 12. The cushion 135 may be a foam cushion. Two opposite sides of the cushion 135 may be coated with adhesive to fix the light sensor 12 and the second flexible printed circuit 132.

In at least one alternative implementation, the first flexible printed circuit 121 may be absent from the circuit board 11. The light sensor 12 is electrically coupled to the second flexible printed circuit 132 and is electrically coupled to the circuit board 11 via the second flexible printed circuit 132, what is needed is that the light sensor 12 and the connector 131 can work normally. Thus, the occupied space of the circuit board 11 is reduced. The surface of the connector 131 away from the circuit board 11 defines a recess portion (not indicated). The light sensor 12 is received in the recess portion, thereby reducing the occupied space of the circuit board 11 in the direction perpendicular to the first side 111. Under this condition, the light sensor 12 is laminated on the connector 131, and the light sensor 12 is directly coupled to the connector 131. In the implementation, a cushion may be provided between the light sensor 12 and the connector 131.

For the circuit board assembly of the above implementations, the light sensor 12 is laminated on the camera module 13, thereby reducing the occupied space of the circuit board 11 along a direction parallel to the first side 111, thus other components can be arranged on the circuit board in a suitable manner.

Figure 3:
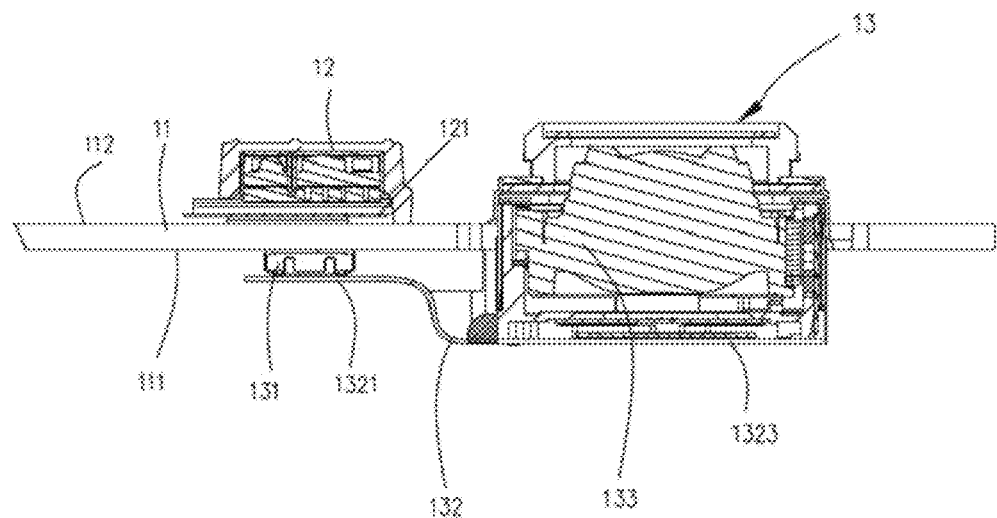
FIG. 3 is a partial sectional view of a circuit board assembly in accordance with another implementation of the present disclosure.

Referring to FIG. 3, in an alternative implementation, the light sensor 12 is arranged on a location of the second side 112 corresponding to a location of the first side 111 where the connector 131 is arranged. The light sensor 12 may be electrically coupled to the circuit board 11 via the first flexible printed circuit 121, or may be coupled to the circuit board 11 in a socket junction manner.

Figure 4:
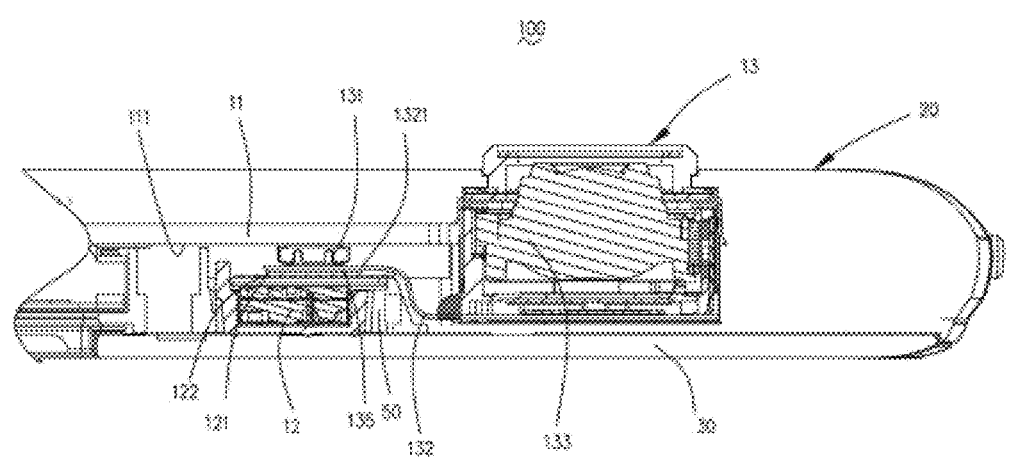
FIG. 4 is a partial sectional view of a terminal in accordance with an implementation of the present disclosure.

Referring to FIG. 4, the present disclosure further provides a terminal 100. The terminal 100 may include a rear housing 20, a display unit 30, and the circuit board assembly 10. The first side 111 of the circuit board 11 faces the display unit 30. The light sensor 12 is arranged between the connector 131 and the display unit 30 and is laminated on the connector 131.

The circuit board assembly 10 is mounted in the rear housing 20. One portion of the camera 133 of the camera module 13 is extended out of the rear housing 20, and another portion of the camera 133 is arranged within the rear housing 20 and fixed to the circuit board 11.

The display unit 30 is fixed to a front housing (not indicated) engageable with the rear housing 20. A receiving space 50 is defined between the connector 131 fixed to the circuit board 11 and a surface of the display unit 30 facing the circuit board 11. The camera module 13 is adjacent to the receiving space 50, and the light sensor 12 is arranged in the receiving space 50, that is, the light sensor 12 is arranged between the surface of the display unit 30 facing the circuit board 11 and the connector 131, or arranged between the surface of the display unit 30 facing the circuit board 11 and the second flexible printed circuit 132 for fixing the connector 131. Therefore, by means of laminating the light sensor 12 on the connector 131 within the receiving space 50, the occupied space of the first side 111 of the circuit board 11 can be reduced without increasing the thickness of the terminal 100. Furthermore, the inner space of the terminal 100 can be sufficiently used, realizing the purpose of reduction of the appearance size of the terminal.

Certainly, in other implementations, the terminal may include the circuit board assembly illustrated in FIG. 4. That is, the light sensor and the connector are arranged on two opposite sides of the circuit board in a stacked manner.

While the present disclosure has been described in detail above with reference to the exemplary implementations, the scope of the present disclosure is not limited thereto. As will occur to those skilled in the art, the present disclosure is susceptible to various modifications and changes without departing from the spirit and principle of the present disclosure. Therefore, the scope of the present disclosure should be determined by the scope of the claims.

What is claimed is:

1. A circuit board assembly, comprising:
   a circuit board having a first side and a second side opposite to the first side;
   a light sensor arranged on the circuit board and electrically coupled to the circuit board;
   a camera module comprising a connector arranged on the circuit board and electrically coupled to the circuit board, wherein the connector and the light sensor are both arranged on the first side of the circuit board, and the light sensor is laminated on the connector; and
   a cushion arranged between the light sensor and the connector.

2. The circuit board assembly of claim 1, further comprising a flexible printed circuit, wherein the light sensor is arranged on one end of the flexible printed circuit, and another end of the flexible printed circuit away from the light sensor is fixed to and electrically coupled to the second side of the circuit board.

3. The circuit board assembly of claim 2, wherein the flexible printed circuit comprises a first surface, and the light sensor is arranged on a portion of the first surface that is away from the connector.

4. The circuit board assembly of claim 3, wherein the flexible printed circuit further comprises a second surface opposite to the first surface, and the circuit board assembly further comprises a reinforcement plate arranged on a location of the second surface corresponding to the portion of the first surface.

5. The circuit board assembly of claim 1, wherein the camera module further comprises another flexible printed circuit and a camera, the another flexible printed circuit comprises a first end and a second end opposite to the first end, the first end is coupled to the connector, and the second end is coupled to the camera.

6. The circuit board assembly of claim 5, wherein the first end of the another flexible printed circuit is arranged between the connector and the light sensor, and the cushion is arranged between the first end of the another flexible printed circuit and the light sensor.

7. A circuit board assembly, comprising:
a circuit board;
a light sensor arranged on the circuit board and electrically coupled to the circuit board; and
a camera module comprising a connector arranged on the circuit board and electrically coupled to the circuit board, wherein the light sensor and the connector are arranged on the circuit board in a stacked manner, wherein
the camera module further comprises a flexible printed circuit and a camera, the flexible printed circuit comprises a first end and a second end opposite to the first end, the first end is coupled to the connector, and the second end is coupled to the camera, the first end is arranged between the connector and the light sensor, and
the circuit board assembly further comprises a cushion arranged between the first end and the light sensor.

8. The circuit board assembly of claim 7, wherein the light sensor and the connector are arranged on the same side of the circuit board.

9. The circuit board assembly of claim 8, wherein the light sensor is laminated on the connector.

10. A terminal, comprising:
a display unit;
a circuit board;
a light sensor arranged on the circuit board and electrically coupled to the circuit board; and
a camera module comprising a connector, wherein the connector is arranged on the circuit board and electrically coupled to the circuit board, and is arranged between the display unit and the circuit board, wherein the connector and the light sensor are both arranged on the same side of the circuit board, and the light sensor is laminated on the connector, and
the terminal further comprises a cushion arranged between the light sensor and the connector.

11. The terminal of claim 10, wherein the camera module further comprises a flexible printed circuit and a camera, the flexible printed circuit comprises a first end and a second end opposite to the first end, the connector is coupled to the first end, and the camera is coupled to the second end.

12. The terminal of claim 11, wherein the light sensor is arranged between the flexible printed circuit and the display unit.

13. The terminal of claim 11, wherein the cushion is arranged between the first end of the flexible printed circuit and the light sensor.

14. The terminal of claim 10, further comprising a flexible printed circuit, wherein the circuit board has a first end and a second end opposite to the first end, the light sensor is arranged on one end of the flexible printed circuit, and another end of the flexible printed circuit away from the light sensor is fixed to and electrically coupled to the second side of the circuit board.

15. The terminal of claim 14, wherein the flexible printed circuit comprises a first surface, and the light sensor is arranged on a portion of the first surface that is away from the connector.

16. The terminal of claim 15, wherein the flexible printed circuit further comprises a second surface opposite to the first surface, and the circuit board assembly further comprises a reinforcement plate arranged on a location of the second surface corresponding to the portion of the first surface.

* * * * *